US007721440B2

(12) United States Patent
Furuya et al.

(10) Patent No.: US 7,721,440 B2
(45) Date of Patent: May 25, 2010

(54) METHOD FOR MANUFACTURING INKJET HEAD

(75) Inventors: Noboru Furuya, Chino (JP); Eiju Hirai, Fujimi (JP)

(73) Assignee: Seiko Epson Corporation (JP)

( * ) Notice: Subject to any disclaimer, the term of this patent is extended or adjusted under 35 U.S.C. 154(b) by 347 days.

(21) Appl. No.: 11/684,790

(22) Filed: Mar. 12, 2007

(65) Prior Publication Data

US 2007/0220722 A1 Sep. 27, 2007

(30) Foreign Application Priority Data

Mar. 13, 2006 (JP) ............................. 2006-067430

(51) Int. Cl.
*B23P 17/00* (2006.01)
*H05K 3/36* (2006.01)

(52) U.S. Cl. ....................................... 29/890.1; 29/830

(58) Field of Classification Search ................ 29/890.1, 29/830; 156/249, 289, 344
See application file for complete search history.

(56) References Cited

U.S. PATENT DOCUMENTS 6,328,434 B1 * 12/2001 Soneda et al. ................. 347/68
6,341,851 B1 * 1/2002 Takayama et al. ............. 347/70
2003/0145463 A1 * 8/2003 Nishikawa et al. ......... 29/890.1
2005/0185026 A1 * 8/2005 Noguchi et al. ............... 347/68

FOREIGN PATENT DOCUMENTS

JP 2000-091656 3/2000
JP 2002-011875 1/2002
JP 2004-006722 1/2004
JP 2005-278265 10/2005
JP 2006-062148 3/2006

* cited by examiner

*Primary Examiner*—A. Dexter Tugbang
*Assistant Examiner*—David P Angwin
(74) *Attorney, Agent, or Firm*—Harness, Dickey & Pierce, P.L.C.

(57) ABSTRACT

A method of manufacturing an inkjet head includes laminating a first separation film on a substrate and laminating a second separation film on the first separation film. A lower structure having a pressure chamber storing ink and an ink ejecting nozzle is formed independently of the substrate. An upper structure having an actuator changing the pressure of the pressure chamber to eject ink is formed on the second separation film with a liquid or vapor phase method. Grooves are formed in the upper structure extending from an upper surface of the upper structure to an interface between the first separation film and the second separation film. A separation liquid applied to the interface at a region exposed by the grooves separates the first and second separation films to release the upper structure from the substrate. The upper structure and the lower structure are then joined together.

6 Claims, 7 Drawing Sheets

METHOD FOR MANUFACTURING INKJET HEAD

The entire disclosure of Japanese Patent Application No. 2006-067430, filed Mar. 13, 2006 is expressly incorporated by reference herein.

BACKGROUND

1. Technical Field

The present invention relates to methods for manufacturing an inkjet head that ejects ink.

2. Related Art

As inkjet heads used for inkjet printers, piezoelectric type inkjet heads and bubble type (thermal type) inkjet heads are known. These inkjet heads are provided with a pressure chamber that stores ink, and structured to push out and eject ink, by an actuator in the case of the piezoelectric type inkjet head, and by a bubble that is generated by boiling a solvent in the case of the bubble type inkjet head.

Pressure chambers of the inkjet heads, for example, in the piezoelectric type and bubble type inkjet heads, are generally formed in a silicon substrate (silicon wafer) by a semiconductor process. Reasons for forming pressure chambers in a silicon substrate are because silicon substrates (silicon wafers) are relatively readily processed, and therefore pressure chambers can be accurately fabricated. For another reason, in the bubble type inkjet head in particular, heaters can be readily formed on a silicon substrate, and the silicon substrate has sufficient heat resistance to tolerate heating by the heaters.

It is important to lower the defect rate caused by foreign matters and defects and improve the yield in order to lower the manufacturing cost in a semiconductor process that uses such silicon substrates (silicon wafers) as described above. The yield is greatly influenced by the chip size. When a desired number of nozzles is to be secured in a chip for inkjet head (hereafter also referred to as a head chip), which is an element for forming the inkjet head, the head chip becomes relatively large, compared to an IC chip, and therefore it is essentially difficult to improve the yield.

For example, an inkjet head with the currently highest dot density is provided with 600 dpi (at a nozzle pitch of 42.3 μm), and the size of a single chip composing this inkjet head is substantially large, compared to an IC chip. Accordingly, the number of head chips that may be obtained from a single silicon substrate (silicon wafer) is fewer, compared to that of IC chips. Therefore, in order to secure a greater number of non-defective head chips, it is necessary to improve the yield to a level higher than that of IC chips.

As described above, for example, in a piezoelectric type inkjet head, pressure chambers alone are formed in a silicon wafer, and other components such as actuators having piezoelectric thin films composed of PZT or the like are laminated on the silicon wafer, thereby assembling the inkjet head. This manufacturing method has been in the mainstream of assembling inkjet heads. However, this manufacturing method has a problem in the accuracy in processing components other than pressure chambers, and therefore its ability in achieving higher integration is limited.

In this regard, a manufacturing method by MEMS (micro electro mechanical systems), in which actuators and wirings to be connected to the actuators are directly formed on a substrate, has been developed in recent years. According to this manufacturing method, actuators and wirings are formed on a substrate, and then the same substrate is processed to form pressure chambers. Further, the substrate is divided into individual pieces (diced) depending on the requirements, whereby head chips that are components of inkjet heads are manufactured (see, for example, Japanese laid-open patent application JP-A-2004-6722).

In such a manufacturing method, when forming a piezoelectric thin film (piezoelectric film) composed of PZT or the like by a vapor phase method or a liquid phase method, the annealing temperature for crystallization may reach, for example, about 600° C. Therefore, the substrate is required to have a heat resistance at least at 600° C. or higher. Accordingly, the use of silicon (a silicon wafer) as a substrate is very practical, because there is no problem in terms of heat resistance, and the aforementioned advantage in which pressure chambers can be readily and highly accurately formed can be maintained.

However, this manufacturing method requires additional steps of forming actuators and wirings to be connected to the actuators on a silicon substrate, compared to the method in related art in which pressure chambers alone are formed from a silicon substrate, such that the processing on the silicon substrate is prolonged, and defects that may be caused by foreign matters and deficiencies would likely occur. As a result, the number of non-defective head chips that can be obtained from a single silicon substrate (silicon wafer) is not very high, in other words, a sufficient yield cannot be achieved. Therefore, non-defective head chips cannot be secured sufficiently in absolute quantity, as described above, and a reduction in the manufacturing cost has substantially been prevented.

SUMMARY

In accordance with an advantage of some aspects of the invention, it is possible to provide a method for manufacturing an inkjet head whereby the yield in manufacturing non-defective head chips can be improved, their absolute quantity can be sufficiently secured, and thus the manufacturing cost can be lowered.

A method for manufacturing an inkjet head in accordance with an embodiment of the invention pertains to a method for manufacturing an inkjet head having a pressure chamber that stores ink, a nozzle that is provided at the pressure chamber and ejects the ink, and an actuator that changes an internal pressure of the pressure chamber to eject the ink in the pressure chamber through the nozzle, and the method includes the steps of: laminating a first separation film and a second separation film on a substrate; forming the actuator on the second separation film by using a liquid phase method or a vapor phase method to manufacture an upper structure; exposing an interface between the first separation film and the second separation film; contacting a separation liquid with the interface between the first separation film and the second separation film to separate the first separation film from the second separation film at the interface, thereby separating the upper structure from the substrate; forming a lower structure having the pressure chamber, independently of the substrate; and joining the upper structure and the lower structure together.

According to the method for manufacturing an inkjet head described above, the upper structure including the actuator and the lower structure having the pressure chamber are not formed from a single substrate, but are formed independently from one another, and then are joined together to form, for example, a head chip that is a component of an inkjet head. Therefore, by joining upper structures that have been examined in advance and determined to be non-defective and lower structures that have been independently examined and determined to be non-defective, the non-defective rate (yield) of head chips can be increased, and their absolute quantity can be sufficiently secured.

According to the method in related art in which actuators and wirings to be connected to the actuators are directly formed on a silicon substrate, and pressure chambers are also formed in the same silicon substrate, the pressure chambers are formed after the actuators and wirings have been formed through many processing steps. Therefore, if defects occur in the pressure chambers due to, for example, foreign matters and deficiencies, the actuators and wirings that are normal, but formed on these defective pressure chambers, would consequentially become defective. Accordingly, these normal actuators and wirings cannot be included in final products, such that the yield is substantially lowered, and a reduction in the cost is prevented.

In contrast, in accordance with the present embodiment, as described above, normal upper structures that are determined non-defective are joined with lower structures that are similarly determined non-defective, whereby the problem in which normal components are rejected as defective can be eliminated, and therefore the non-defective rate (yield) of head chips can be improved, their absolute quantity can be sufficiently secured, and thus the manufacturing cost can be lowered.

Also, in the present embodiment of the invention, a separation liquid is brought in contact with the interface between the first separation film and the second separation film, thereby separating the first separation film from the second separation film at the interface, and thus separating the upper structure from the substrate. Therefore, separation of the upper structure becomes very easy, and the substrate after having been separated from the upper structure can be reused.

Also, the manufacturing process for forming the upper structure of the inkjet head which includes a high-temperature process, and the manufacturing process for forming the lower structure which includes a low-temperature process are not continuously conducted, but conducted independently from one another. Therefore the process management is easier, and thus the productivity can be improved.

In the method for manufacturing an inkjet head described above, the substrate may preferably be a silicon substrate.

As described above, the substrate after having been separated from the upper structure can be reused, such that, by reusing the silicon substrate that is formed from an expensive silicon wafer, the cost can be reduced.

A high temperature heat treatment process is necessary for forming piezoelectric elements on a substrate in particular, and therefore a sufficient heat resisting property is required as a substrate. By using a silicon substrate as the substrate, the requirement for heat resistance can be satisfied. Also, when actuators are formed by a semiconductor process, the manufacturing method of the present embodiment is advantageous, because a wide range of choices of substrate sizes is available, a large-size substrate (e.g., a 12 inch wafer) can be used, and an existing semiconductor processing apparatus can be used as it is.

Also, in the method for manufacturing an inkjet head described above, the first separation film may preferably be composed of silicon oxide, the second separation film may preferably be composed of zirconium oxide, and a separation liquid may preferably be water.

By contacting water as the separation liquid with the interface between the first separation film composed of silicon oxide and the second separation film composed of zirconium oxide, the first separation film and the second separation film can be favorably separated from each other at the interface, although its detailed mechanism is not known, and the upper structure can be readily separated from the substrate. Accordingly, the substrate after having been separated can be readily reused, after removing the first separation film depending on the requirements. Also, as the separation liquid is water, the water does not negatively influence the upper structure even when it touches the upper structure. Therefore, an easy method can be used for contacting the separation liquid with the interface: for example, the substrate can be entirely dipped in water.

Also, in the method for manufacturing an inkjet head described above, in the step of exposing the interface between the first separation film and the second separation film, grooves that define the upper structure in a predetermined chip unit may preferably be formed such that the grooves extend from the side of the upper structure to reach at least the interface between the second separation film and the first separation film.

With the structure described above, a separation liquid can be later contacted with the interface between the first separation film and the second separation film, thereby separating the first separation film from the second separation film at the interface, such that the upper structure in a chip unit can be separated from the substrate. Accordingly, the obtained upper structure can be used as it is in a joining step to be conducted later.

Further, in the method for manufacturing an inkjet head described above, the actuator may preferably be formed from a piezoelectric element composed of PZT or the like. By composing the actuator with a piezoelectric element, an accurate ink ejection driving can be performed, and a higher speed driving becomes possible, compared to the bubble driving method.

Also, in the method for manufacturing an inkjet head described above, the lower structure may preferably be formed by an electroforming method. When the lower structure is formed by an electroforming method, the lower structure having the pressure chamber can be formed at low cost with stable quality, because the electroforming method excels in dimensional accuracy and productivity in manufacturing products.

In the method for manufacturing an inkjet head described above, the lower structure may preferably be formed by an electroforming method using Ni or Ni alloy. Because Ni or Ni alloy excels in chemical resistance, and are relatively inexpensive, pressure chambers that are resistive to a variety of types of ink can be accurately formed at low cost by a process with excellent productivity.

DESCRIPTION OF EXEMPLARY EMBODIMENTS

Preferred embodiments of the invention are described below. Prior to describing a method for manufacturing an inkjet head in accordance with the embodiment of the invention, an example of an inkjet head that can be obtained by the method is described.

Figure 1:
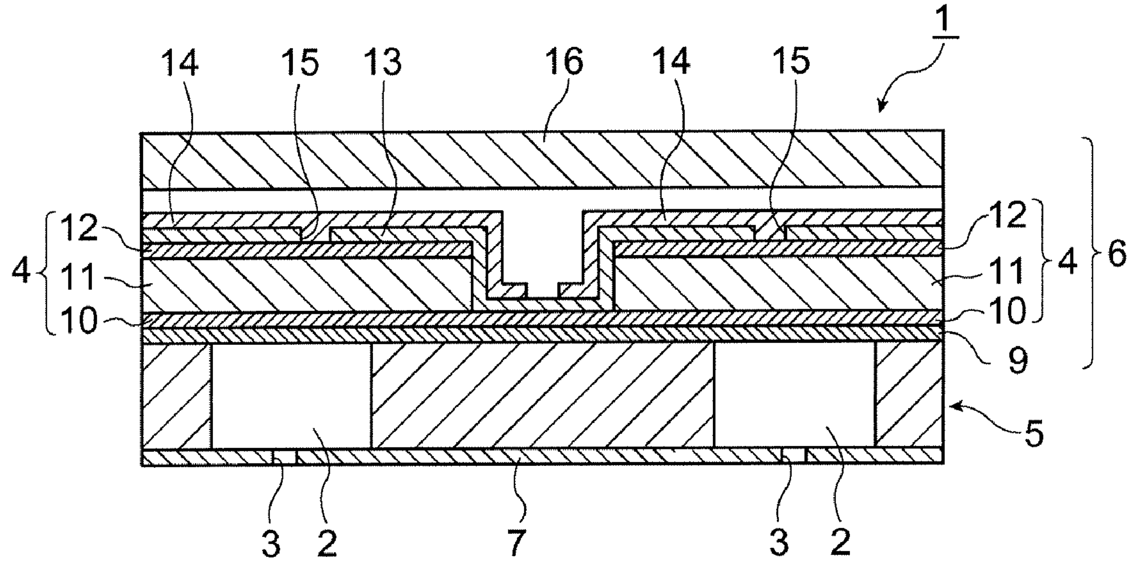
FIG. 1 is a cross-sectional view in part of an inkjet head in accordance with in accordance with an embodiment of the invention.

FIG. 1 is a view of a major portion of an example of an inkjet head, in other words, a view showing a major portion of a head chip. Reference numeral 1 in FIG. 1 denotes an inkjet head. The inkjet head 1 may be used for an inkjet printer, and is equipped with pressure chambers 2 that store ink, nozzles 3 that are provided at the pressure chambers 2 and eject the ink, and actuators 4 that change an internal pressure of the pressure chambers 2 to thereby eject the ink in the pressure chambers 2 through the nozzles 3.

Also, the inkjet head 1 is formed from a generally rectangular parallelepiped head chip or a plurality of head chips (not shown), each having a lower structure 5 forming a portion including the pressure chambers 2 and an upper structure 6 forming a portion including the actuators 4. The head chip is provided with multiple actuators 4 (for example, in a matrix of 180×2 rows, or 360×2 rows), and pressure chambers 2 formed in one-to-one correspondence with the actuators 4.

The lower structure 5 is in a generally rectangular parallelepiped shape, and is preferably composed of metal such as nickel (Ni) or its alloy. As described above, the lower structure 5 has the multiple pressure chambers 2, and a nozzle plate 7 with the nozzles 3 formed therein attached to the bottom surface side of the inkjet head 1. It is noted that the lower structure 5 can be formed from silicon, any one of ceramics materials, glass or the like, other than metal such as Ni or its alloy. It is noted that the pressure chambers 2 are cavities that penetrate the lower structure 5 from top to down, covered by the nozzle plate 7 at their bottom surface (lower surface) side as described above, and covered by a vibration plate 9 of the upper structure 6 at their upper surface side to be described below. Therefore each of the pressure chambers 2 is formed generally in a closed state except its nozzle aperture and ink supply port.

Figure 2:
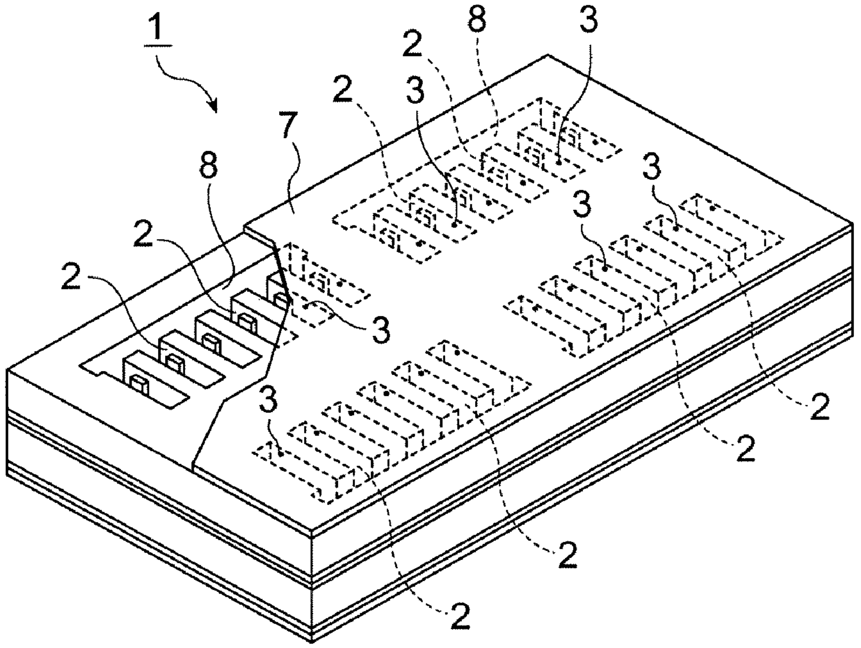
FIG. 2 is a perspective view showing a bottom side of the inkjet head shown in FIG. 1.

As shown in FIG. 2 that is a perspective view indicating the bottom surface side of the inkjet head 1, the pressure chambers 2 are arranged in plurality in two rows, and their bottom surface side is covered and closed by the nozzle plate 7. The multiple nozzles 3 formed in the nozzle plate 7 are disposed at positions connecting to the respective pressure chambers 3, and regularly arranged in two rows.

In FIG. 2, the pressure chambers 2 are shown in a simplified configuration in a matrix of 12×2 rows. However, in effect, many more pressure chambers 2 are formed in correspondence with the numerous actuators 4, as described above. Also, in the present embodiment, the pressure chambers 2 are shown in two rows, but they may not necessarily be in two rows. The number of nozzles necessary for each row, the chip size, the total number of required nozzles, and the like are to be considered in deciding an appropriate number of rows. In general, the yield of actuators and pressure chambers can be improved by reducing the number of rows, and reducing the chip size, but the steps of assembling chips in inkjet heads become more complex.

The pressure chambers 2 are connected to one another by a connecting passage section 8 formed along an arrangement direction of the pressure chambers 2, whose illustration is omitted in FIG. 1, but shown in FIG. 2. Further, the connecting passage section 8 is provided with a reservoir (not shown) connected thereto, and an ink introduction port (not shown) is formed in the reservoir. With the structure described above, ink is supplied from an ink tank (not shown) provided independently of the inkjet head 1, through a tube (not shown) to the ink introduction port, and through the reservoir and the connecting passage section 8, to the pressure chambers 2.

The upper structure 6 is joined to an upper surface side of the lower structure 5, in other words, to a surface of the lower structure 5 on the opposite side of the nozzle plate 7, as shown in FIG. 1. The upper structure 6 has a vibration plate 9 at its bottom surface side, and a lower surface of the vibration plate 9 is joined to the lower structure 5, whereby the upper structure 6 is joined to the lower structure 5 in one piece. The vibration plate 9 covers the upper surface side of the pressure chambers 2 to thereby close the pressure chambers 2, as described above. The vibration plate 9 is displaced (flexed) by driving of the actuator 4, thereby changing an internal pressure of each of the pressure chambers 2.

The vibration plate 9 is formed from a single layered film composed of zirconium oxide ($ZrO_x$ such as $ZrO_2$) in the present embodiment, to a thickness of, for example, about 1-2 μm. The zirconium oxide film functions as a second separation film in the manufacturing process, to be described below.

The actuators 4 are formed on the vibration plate 9. The actuators 4 are arranged in one-to-one correspondence with the pressure chambers 2, as described above, and disposed immediately above the respective pressure chambers 2 arranged in two rows, as shown in FIG. 1, and therefore the actuators 4 are also arranged in two rows. The actuators 4 are formed from piezoelectric elements in the present example, and are each composed of a lower electrode 10, a piezoelectric film 11 and an upper electrode 12.

The lower electrode 10 is formed over the entire surface of the vibration plate 9 in the present example, and is composed of platinum or the like having a thickness of, for example, about 0.2 μm. The lower electrode 10 is formed on the entire surface of the vibration plate 9, and therefore is displaced with the vibration plate 9 by the driving of the actuators 4. In other words, the lower electrode 10 is a component of each of the actuators 4, and exhibits the same function as that of the vibration plate 9. It is noted that the lower electrode 10 in the present example serves as a common electrode for the multiple actuators (piezoelectric elements) 4.

The piezoelectric films 11 are formed from PZT ($Pb(Zr, Ti)O_3$) or the like having a thickness of, for example, about 1 μm, and the upper electrodes 12 are formed from platinum or the like having a thickness of, for example, about 0.1 μm. The piezoelectric films 11 and the upper electrodes 12 are formed in islands independently from one another for the respective actuators 4, unlike the lower electrode 10. In such a structure, the actuators 4 are driven independently from one another.

A wiring 14 is connected to each of the actuators 4 through a protection film 13. In other words, the protection film 13 that covers the piezoelectric films 11 and the upper electrode 12 and is composed of aluminum oxide (AlOx such as $Al_2O_3$) or the like is formed over the lower electrode 10. Contact holes 15 that connect to the respective upper electrodes 12 are formed in the protection film 13, whereby the wiring 14 is electrically connected to the upper electrodes 12, respectively.

A sealing plate 16 is attached to the top side of the upper structure 6 that is formed from the vibration plate 9, the actuators 4 and the wirings 14, thereby forming the inkjet head 1 of the present embodiment. The sealing plate 16 has a function to protect the actuator sections, a function as a wiring substrate with a driver control IC chip provided thereon, and a function as a wafer support substrate when CMP is performed. Alternatively, without directly providing a control IC on the sealing plate 16, a flexible circuit board (not shown) may be externally provided and connected to the wiring 14 through the sealing plate 16, and a semiconductor device that controls driving of the actuators 4 may be provided on the flexible circuit board.

In the inkjet head 1 having the structure described above, upon energizing the actuator 4, the piezoelectric film 11 is flexed and displaced by the electrostrictive effect, whereby the piezoelectric film 11 is bent outwardly. Then, the lower electrode 10 and the vibration plate 9 are concurrently displaced together with the piezoelectric film 11, and therefore bend outwardly (to the side of the sealing plate 16), whereby the volume in the pressure chamber 2 is increased, which lowers its internal pressure. When the volume of the pressure chamber 2 increases and its internal pressure lowers, and if ink is filled in the reservoir (not shown) connected through the connection passage section 8, the ink flows in the pressure chamber 2 from the reservoir through the connection passage section 8 in an amount corresponding to the increase in the volume of the pressure chamber 2.

Then, when the actuator 4 in the state described above is energized by the reverse potential, the vibration plate 9 flexes toward the side of the pressure chamber 2, whereby the volume of the pressure chamber 2 decreases, and its internal pressure increases. By this, the ink is ejected in the form of a droplet through the nozzle 3. It is noted that the ink is supplied to the reservoir through the tube (not shown) from the ink tank (not shown) provided independently of the inkjet head 1, as described above.

Next, a method for manufacturing an inkjet head in accordance with an embodiment of the invention is described based on the inkjet head 1 having the structure described above. The manufacturing method of the invention is different from other manufacturing methods in related art in that a lower structure 5 and an upper structure 6 are formed independently from one another by a semiconductor process, and the two structures are joined together when they are judged as non-defective, thereby obtaining a non-defective inkjet head 1.

Figure 3A:
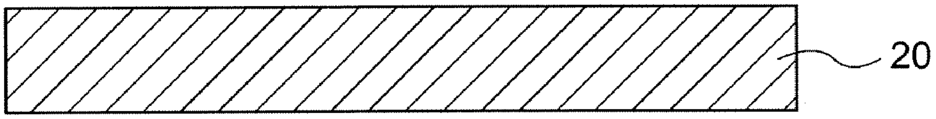
FIGS. 3A-3D are views showing steps of manufacturing the inkjet head shown in FIG. 1.

In accordance with the present embodiment, a silicon substrate (silicon wafer) 20 is prepared, as shown in FIG. 3A. In the method in related art, a silicon substrate is directly processed by anisotripic etching with KOH, to thereby form pressure chambers, such that an expensive Si (110) substrate needs to be used as the silicon substrate. However, according to the invention, a silicon substrate is not processed to form pressure chambers, such that an expensive Si (110) substrate does not need to be used, and a relatively inexpensive ordinary Si (100) substrate can be used.

Figure 3B:
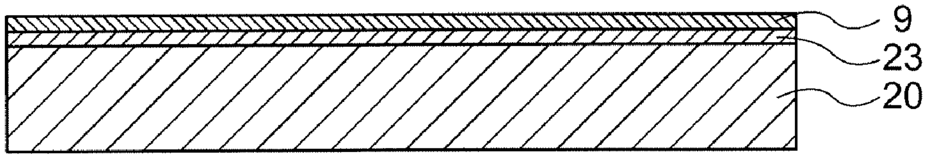

Then, a thermal oxidation treatment is applied to the silicon substrate 20, thereby forming a silicon oxide ($SiO_2$) film on its surface layer portion, which is used as a first separation film 23, as shown in FIG. 3B. Then, a film of zirconium (Zr) is formed on the first separation film 23 by a sputter method. Then, by applying a thermal oxidation treatment, a film of zirconium oxide ($ZrO_2$) is formed from the zirconium film, whereby a vibration plate 9 is formed. The vibration plate 9 composed of the zirconium oxide film ($ZrO_2$) is used as a second separation film in the present embodiment of the invention.

Figure 3C:
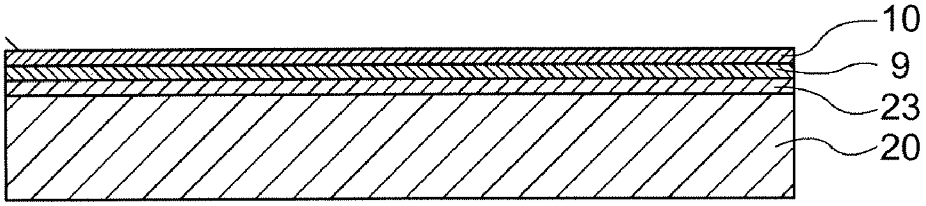

Then, a film of platinum is formed on the vibration plate 9 by a vapor phase method such as a sputter method, whereby a lower electrode 10 is formed, as shown in FIG. 3C. The platinum electrode film may be formed not only by the sputter method, but also by a vapor phase process such as a vapor deposition method, or a liquid phase process such as a plating method. Prior to forming the lower electrode 10, an adhesive layer is formed on the zirconium oxide film. In general, the adhesive layer may be composed of TiOx, but ZrOx may also be used.

Although platinum is used for the lower electrode 10 in the present embodiment, other metals such as Ir, and conductive oxides such as $SrRuO_3$, $LaNiO_3$ or the like may be used. The lower electrode 10 requires a function not only as an electrode, but also a function to control the orientation of a piezoelectric film 11 to be formed above. In particular, an oxide electrode having a perovskite structure oriented to (100) is most convenient to control the orientation of PZT.

Figure 3D:
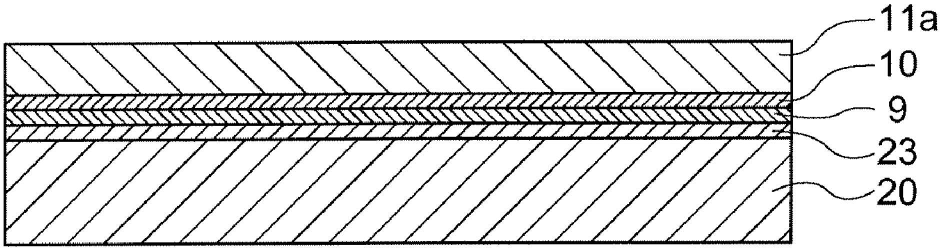

Then, a piezoelectric layer 11*a* composed of PZT is formed on the lower electrode 10 by a liquid phase method such as a sol-gel method, as shown in FIG. 3D. The method for forming the piezoelectric layer 11*a* by a sol-gel method may include dissolving (dispersing) compounds containing metal elements composing PZT, i.e., Pb, Zr and Ti, such as, for example, organic compounds such as alkoxides, in an organic solvent (dispersion medium), disposing the obtained solution (dispersion liquid) on the lower electrode 10 by a known coating method, and then sintering the coated solution, whereby the piezoelectric layer 11*a* is obtained. Besides the sol-gel method, the piezoelectric layer 11*a* may be formed by other methods, such as, for example, a vapor phase method such as a sputter method, a CVD method and a MOCVD method, or a liquid phase process such as a hydrothermal method.

Figure 4A:
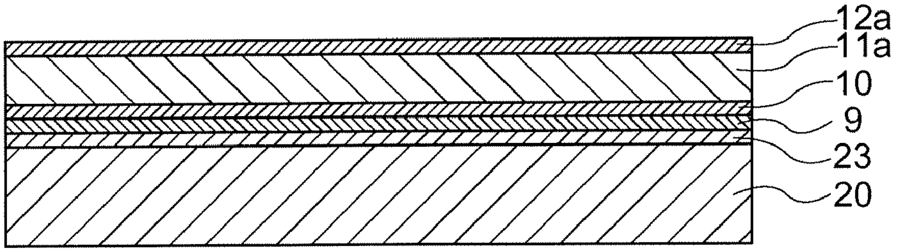
FIGS. 4A-4D are views showing steps of manufacturing the inkjet head shown in FIG. 1.

Then, a film of platinum is formed on the piezoelectric layer 11*a* by a vapor phase method such as a sputter method, whereby an upper electrode layer 12*a* is formed, as shown in FIG. 4A. It is noted that the upper electrode 12 may be formed by a liquid phase method such as a plating method, like the lower electrode 10, and may not necessarily be composed of platinum.

Figure 4B:
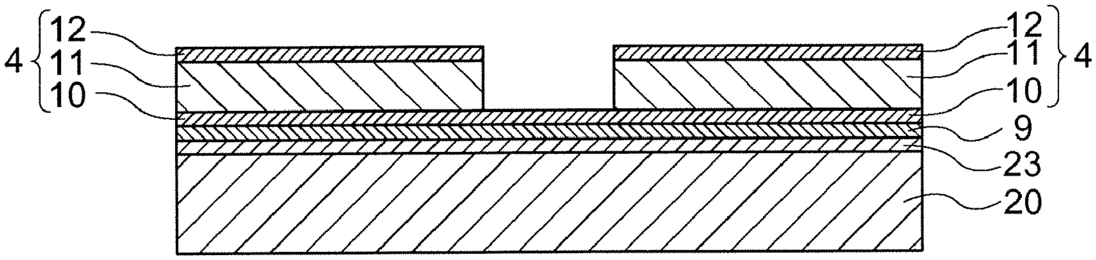

When the piezoelectric layer 11*a* and the upper electrode layer 12*a* are formed on the lower electrode 10, a resist pattern (not shown) is formed by known resist technique, and exposure and development technique. Then, by using the resist pattern as a mask, dry etching such as reactive ion etching (RIE) is conducted to pattern the upper electrode layer 12*a* and the piezoelectric layer 11*a*, whereby upper electrodes 12 and piezoelectric films 11 are formed, as shown in FIG. 4B. As a result, actuators 4 composed of piezoelectric elements can be obtained.

Figure 5:
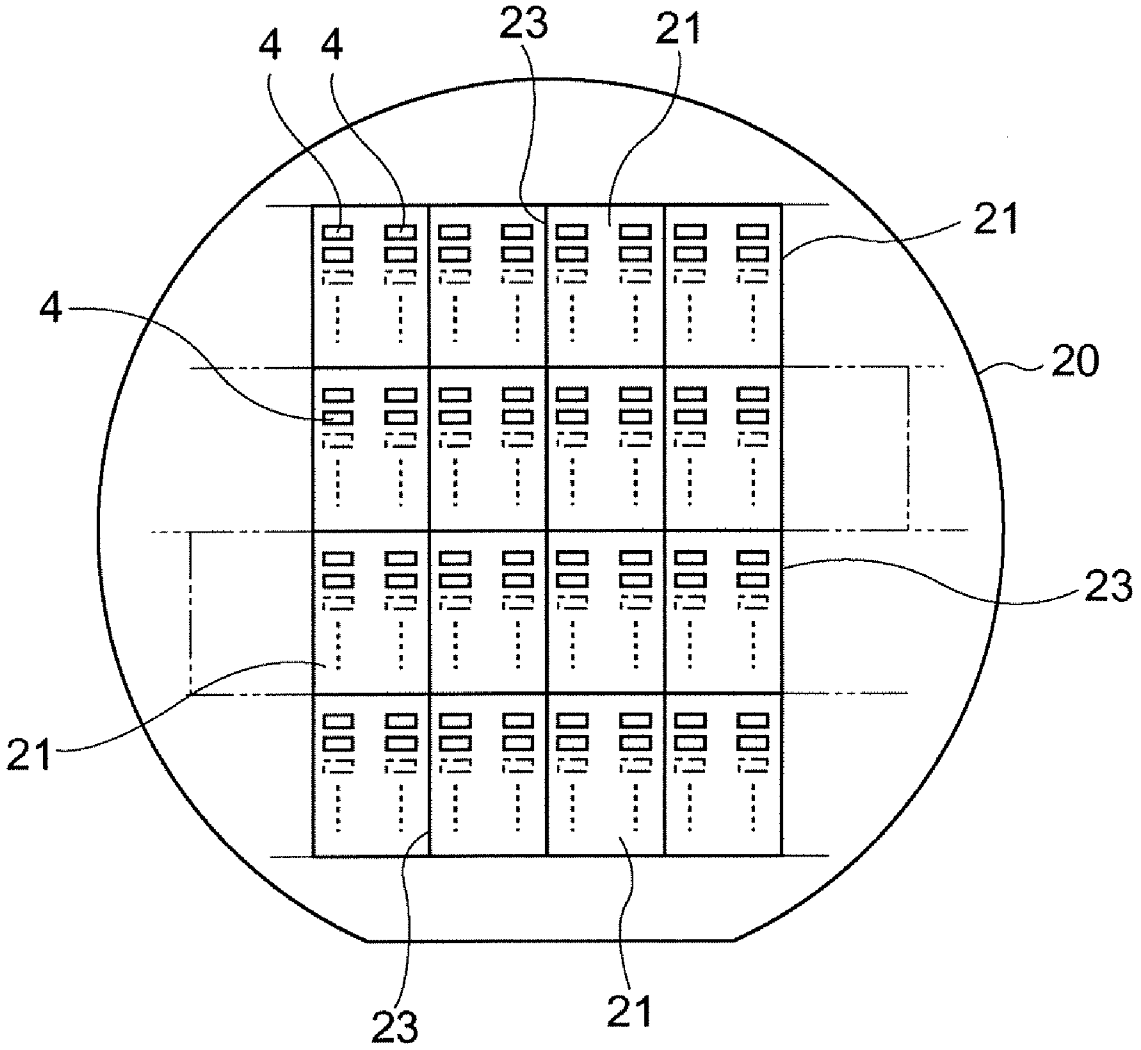
FIG. 5 is a plan view of a silicon substrate, for describing a manufacturing process.

When the actuators 4 are formed by patterning the upper electrode layer 12*a* and the piezoelectric layer 11*a*, a plurality of (for example, 40) chip regions 21 are defined on the silicon substrate 20, as shown in FIG. 5. A predetermined number of actuators 4 are formed in two rows in each of the chip regions 21. It is noted that, by the etching for forming the actuators 4, grooved boundary sections 22 that define, in particular, the chip regions 21 and divide adjacent ones of the chip regions 21 are formed. The boundary sections 22 may be formed by, for example, etching the layers to the second separation film composed of zirconium oxide in the vibration plate 9 to thereby expose the first separation film 23 composed of silicon oxide.

Figure 4C:
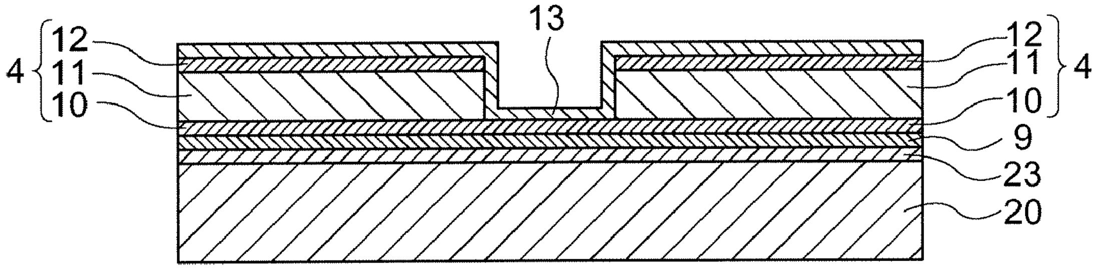

Then, as shown in FIG. 4C, a protection film 13 that covers the actuators 4 is formed over the silicon substrate 20 by a sputter method or the like. It is noted that the protection film 13 protects the PZT from external environments (humidity in particular), and may preferably be as thin as possible to the extent that the protection film 13 can perform its function, and the actuator is not prevented from bending.

Figure 4D:
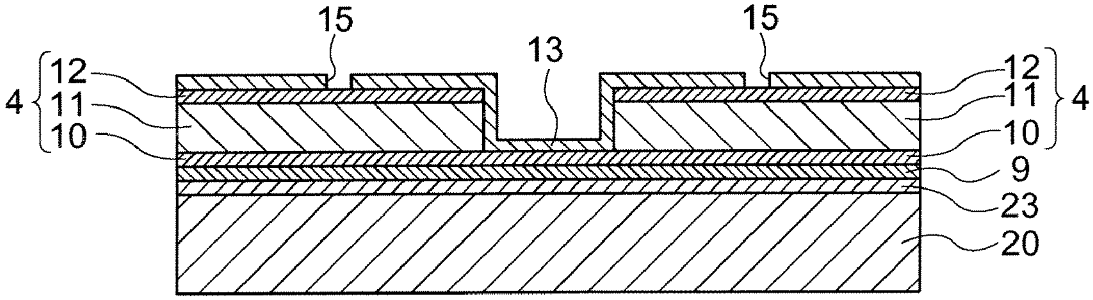

Then, a resist pattern (not shown) is formed on the protection film 13, and the protection film 13 is etched by using the resist pattern as a mask, whereby contact holes 15 that connect to the upper electrodes 12 are formed, as shown in FIG. 4D.

In the case of contact holes formed in an interlayer dielectric film of a semiconductor chip, in general, their aspect ratio is large, and tungsten plugs or the like need to be formed in the contact holes. However, in the present embodiment, the protection film 13, which corresponds to the aforementioned interlayer dielectric film, is very thin, which is about 100 nm in thickness, and the contact diameter would be greater than several μm, such that the aspect ratio of each of the contact holes 15 is extremely small. For this reason, plugs are not required to be formed, and a wiring layer can be directly formed after the contact holes 15 have been formed.

Figure 6A:
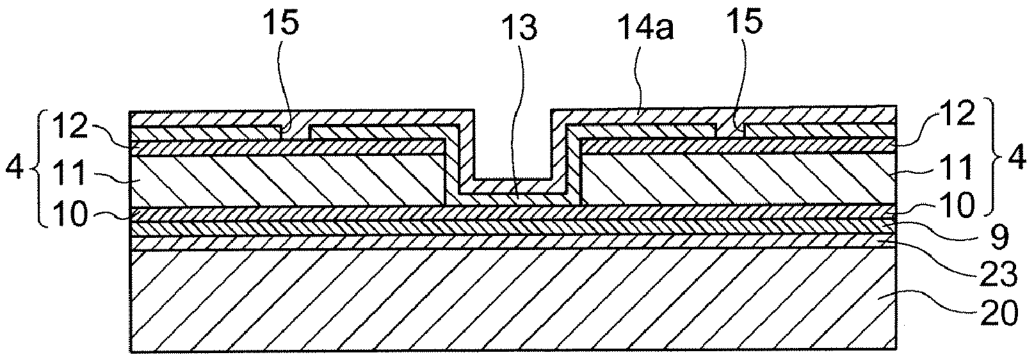
FIGS. 6A-6C are views showing steps of manufacturing the inkjet head shown in FIG. 1.
Figure 6B:
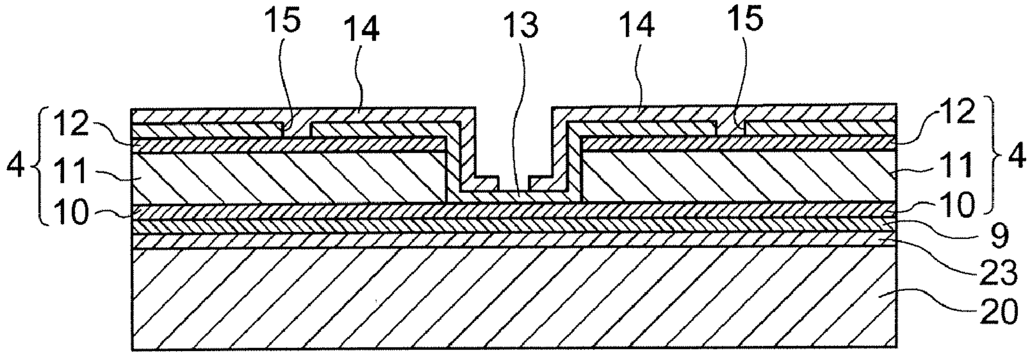

Then, a film of wiring material such as Al, Au or the like is formed on the protection film 13, as shown in FIG. 6A, thereby forming a wiring layer 14*a*. Then, the wiring layer 14*a* is patterned by known resist technique, exposure and development technique, and etching technique, whereby wirings 14 that electrically connect to the upper electrodes 12 are formed, as shown in FIG. 6B.

When the wirings 14 are connected to the actuators 4, respectively, all of the actuators 4 on the silicon substrate 20 are examined for their electrical property, and for their external appearance, whereby electrical characteristics and external appearance of each of the chip regions 21 shown in FIG. 5 are judged for their acceptance.

Figure 6C:
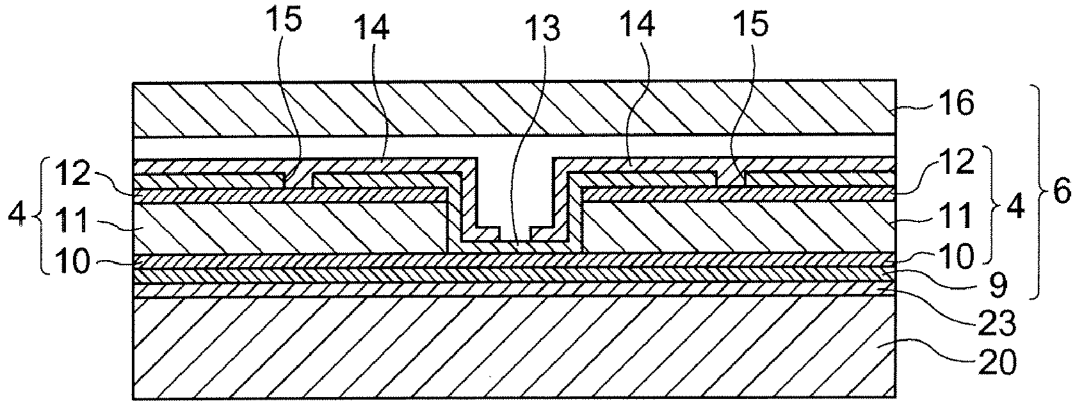

Then, an interlayer dielectric film or the like (not shown) that covers the wirings 14 may be formed depending on the requirements, and a sealing plate 16 is adhered to the entire surface over the silicon substrate 20 by adhesive or the like, as shown in FIG. 6C. As a result, upper structures 6 are formed for the respective chip regions 21 shown in FIG. 5 on the silicon substrate 20.

Figure 7A:
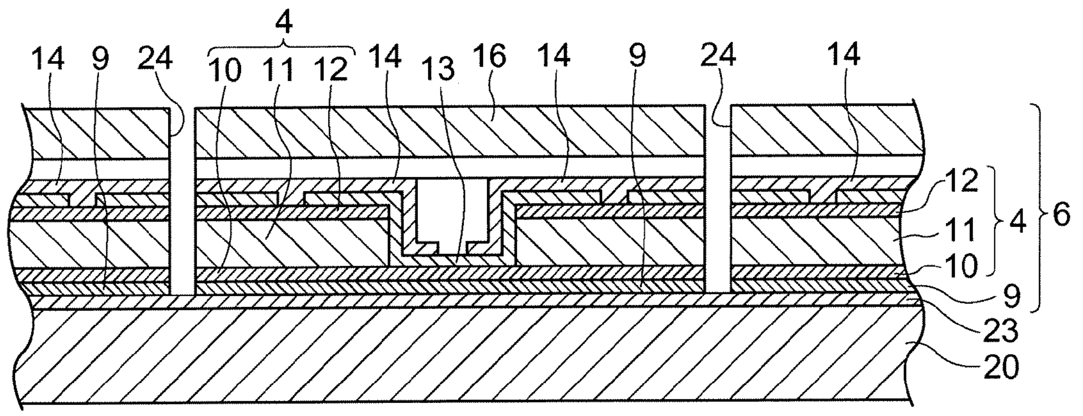
FIGS. 7A-7B are views showing steps of manufacturing the inkjet head shown in FIG. 1.

Then, by conducting dicing or etching on the side of the sealing plate 16, as shown in FIG. 7A, grooves 24 are formed along the boundary sections 22 shown in FIG. 5. In this instance, the dicing or etching is performed down to the second separation film (vibration plate 9), thereby exposing the first separation film 23 in the grooves 24, whereby the upper structures 6 are defined in predetermined chips by the grooves 24. By forming the grooves that expose the first separation film 23, the interface between the first separation film 23 and the second separation film (vibration plate 9) can be exposed in the grooves 24.

Figure 7B:
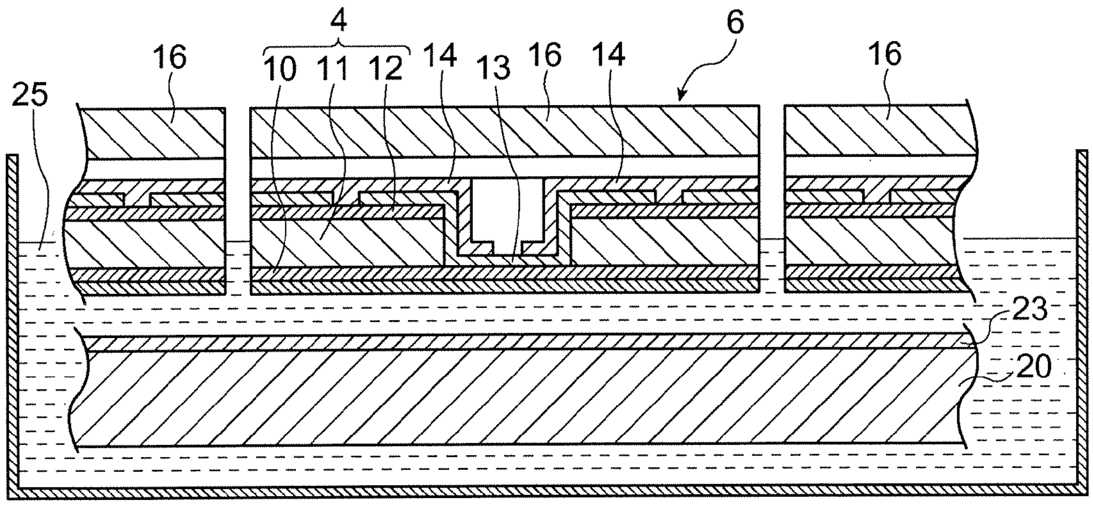

Then, as shown in FIG. 7B, the silicon substrate 20 is dipped in water 25, such as, pure water or purified water, which is a separation liquid in accordance with the embodiment of the invention, thereby introducing the water in the grooves 24. As a result, the water (separation liquid) is brought in contact with the interface between the first separation film 23 and the second separation film (vibration plate 9) exposed in the grooves 24. By this, the first separation film 23 and the second separation film (vibration plate 9) are peeled off from each other at the interface, and therefore the upper structure 6 is separated from the substrate 20. Since the grooves 24 are formed in a manner to define the upper structures 6 in predetermined chip units, the upper structures 6 separated from the silicon substrate 20 become separated from one another in chip units, and therefore can be used as it is for a joining step to be conducted later. Accordingly, when the upper structures 6 in chip units in this manner, those of the upper structures 6 that are judged non-defective based on the examination results for electrical property and external appearance previously conducted are selected, and used for the next step.

It is noted that the silicon substrate 20 after having been separated from the upper structures 6 can be reused, after removing the first separation film 23 (silicon oxide film) on its surface depending on the requirements, for forming upper structures 6 again.

Figure 8A:
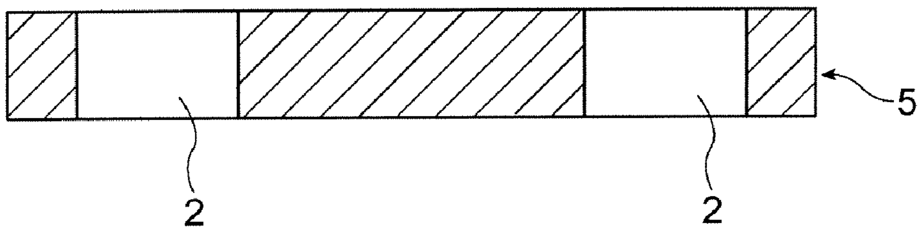
FIGS. 8A-8B are views showing steps of manufacturing the inkjet head shown in FIG. 1.

On the other hand, independently of the process using the silicon substrate 20, a lower structure 5 having pressure chambers 2 is formed, as shown in FIG. 8A. It is noted that the lower structure 5 is formed to have a structure corresponding to each of the chips, in other words, a structure in which the pressure chambers 2 are arranged, for example, in a matrix of 180×2 rows, or 360×2 rows. The lower structures 5 may preferably be formed by, in particular, an electroforming method. More specifically, an electroforming mold for the lower structures 5 is formed in advance, and an electroplating is conducted using the electroforming mold as a cathode to electro-deposit a metal on the internal surface of the electroforming mold, whereby the lower structures 5 are obtained. Ni or Ni alloy may be selected as the metal that is electro-deposited, whereby the lower structures 5 are formed from Ni or Ni alloy. Because Ni or Ni alloy excels in chemical resistance, and are relatively inexpensive, the pressure chambers 2 that are resistive to a variety of types of ink can be formed at low cost, when the lower electrodes 5 are formed from Ni or Ni alloy.

Depending on inks that are used in the completed inkjet head 1, a chemical reaction may occur between the ink in the pressure chambers 2 and the lower structure 5, which may cause a galvanic effect and/or erosion. In this case, a protection film composed of, for example, tantalum oxide (TaOx) or the like may be formed in advance in the pressure chambers 2 (and similarly on the actuator vibration plates), whereby reactions and the like with the ink can be avoided.

Then, the lower structures 5 thus formed are examined for their external appearance and the like, to judge whether they are acceptable as products. Then, those of the lower structures 5 that have been judged non-defective based on the results of examination are selected, and used for the next step.

Figure 8B:
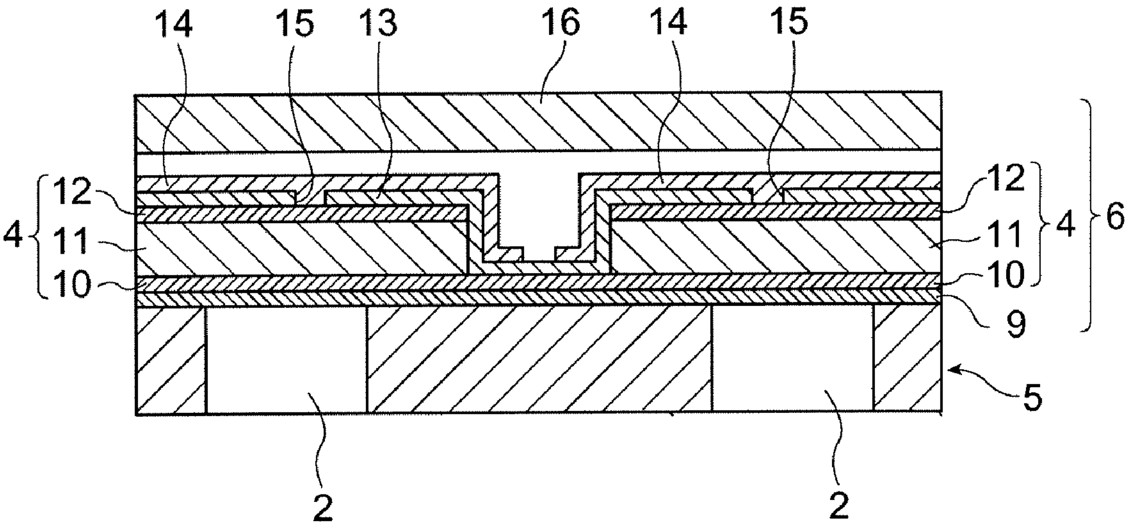

Then, the upper structure 6 that has been judged non-defective and the lower structure 5 that has been judged non-defective are assembled together, and the upper structure 6 on the side of the vibration plate 9 and the lower structure 5 on the side of its upper surface are joined together, as shown in FIG. 8B. As the joining method, diffusion joint in which electrons are diffused by application of pressure and heat, hydrogen joint, direct joint in which joint surfaces are activated by plasma treatment and directly joined together, and adhesion by adhesive can be used.

Then, a nozzle plate 7 is attached by adhesive or the like to the bottom surface side of the lower structure 5 in an ordinary manner, whereby a head chip (not shown) is obtained. It is noted that the nozzle plate 7 may be attached, prior to joining the upper structure 6 and the lower structure 5. Then, a single head chip or a plurality of head chips thus manufactured are used and assembled in an ordinary manner, whereby an inkjet head shown in FIG. 1 is obtained. The inkjet head 1 thus obtained is used for an ink jet printer, an industrial ink jet apparatus and the like.

According to the method for manufacturing the inkjet head 1, the upper structure 6 that includes the actuators 4 and the lower structure 5 that includes the pressure chambers 2 are formed independently from one another, and these structures are joined together to form a head chip that becomes a component of the inkjet head 1. Accordingly, those of the upper structures 6 that have been examined in advance and judged non-defective, and those of the lower structures 5 that have been separately examined and judged non-defective are joined together, whereby the non-defective rate (yield) of the head chips can be improved, and their absolute quantity can be sufficiently secured.

According to the method in related art in which actuators and wirings to be connected to the actuators are directly formed on a silicon substrate, and pressure chambers are also formed in the same silicon substrate, the pressure chambers are formed after the actuators and wirings have been formed through many processing steps. Therefore, if defects occur in the pressure chambers due to, for example, foreign matters and deficiencies, the actuators and wirings that are normal, but formed on these defective pressure chambers, would consequentially become parts of the defective products. Accordingly, these normal actuators and wirings cannot be included in final products, such that the yield is substantially lowered, and a reduction in the cost is prevented in the method in related art.

In contrast, in accordance with the present embodiment of the invention, as described above, normal upper structures 6 that are judged non-defective are joined with lower structures that are similarly judged non-defective, whereby the problem in which normal components are rejected as defective can be eliminated, and therefore the non-defective rate (yield) of head chips can be improved, their absolute quantity can be sufficiently secured, and thus the manufacturing cost can be lowered.

Also, in the present embodiment of the invention, a separation liquid is brought in contact with the interface between the first separation film 23 and the second separation film (vibration plate 9), thereby separating the first separation film 23 from the second separation film at the interface, and thus separating the upper structure 6 from the silicon substrate 20. Therefore, separation of the upper structure becomes very easy, and the silicon substrate 20 after having been separated from the upper structure 6 can be reused. Consequently, by reusing the silicon substrate 20 that is formed from an expensive silicon wafer, the cost can be reduced.

Also, the manufacturing process for forming the upper structure 6 of the inkjet head 1 which includes a high-temperature process, and the manufacturing process for forming the lower structure 5 which includes a low-temperature process are not continuously conducted, but conducted independently from one another. Therefore the process management becomes easier, and thus the productivity can be improved.

It is noted that the invention is not limited to the embodiment described above, and many changes can be made without departing from the subject matter of the invention. For example, in the embodiment described above, piezoelectric elements are used as actuators, but driver elements other than such electromechanical converter elements can be used as the actuators. Concretely, it is possible to use a driver element that uses an electro-thermal converter element as an energy generation element, a continuous type driver element of an electrification control type or a voltage application vibration type, an electrostatic suction type driver element, and a driver element of the type in which heat is generated by irradiation of electromagnetic waves such as laser and liquid is ejected by an action of the generated heat. Also, the lower structures 5 may be formed by, for example, a transfer technique using nano-prints, without being limited to the electroforming method.

Moreover, the embodiment described above uses exfoliation between the first separation film and the second separation film. However, a separation sacrificial layer may be formed, and the actuator may be separated from the substrate by dissolving the layer. As an example of a layer structure in this case, layers of silicon oxide/zinc oxide/zirconium oxide can be enumerated. By dissolving the zinc oxide by water, the silicon oxide layer and the zirconium oxide layer can be separated from each other.

What is claimed is:

1. A method for manufacturing an inkjet head including a lower structure and an upper structure, the lower structure having a pressure chamber that stores ink and a nozzle that is provided at the pressure chamber and ejects the ink, and the upper structure having an actuator that changes an internal pressure of the pressure chamber to eject the ink in the pressure chamber through the nozzle, the method comprising the steps of:

laminating a first separation film on a substrate;

laminating a second separation film directly on the first separation film;

forming the upper structure having the actuator on the second separation film by using one of a liquid phase method and a vapor phase method;

forming grooves in the upper structure that extend from an upper surface of the upper structure to an interface between the first separation film and the second separation film;

contacting a separation liquid with the interface between the first separation film and the second separation film to separate the first separation film from the second separation film at the interface, the separation liquid contacting the interface at a region that is exposed by formation of the grooves, the contacting of the separation liquid at the interface thereby separating the upper structure from the substrate including the first separation film;

forming the lower structure having the pressure chamber, independently of the substrate; and joining the upper structure and the lower structure together.

2. A method for manufacturing an inkjet head according to claim 1, wherein the substrate is a silicon substrate.

3. A method for manufacturing an inkjet head according to claim 1, wherein the first separation film is composed of silicon oxide, the second separation film is composed of zirconium oxide, and the separation liquid is water.

4. A method for manufacturing an inkjet head according to claim 1, wherein the actuator is formed from a piezoelectric element.

5. A method for manufacturing an inkjet head according to claim 1, wherein the lower structure is formed by an electroforming method.

6. A method for manufacturing an inkjet head according to claim 1, wherein the lower structure is formed from one of Ni and Ni alloy.

* * * * *